(12) United States Patent
Kaunisto et al.

(10) Patent No.: US 7,791,433 B2
(45) Date of Patent: Sep. 7, 2010

(54) APPARATUS, METHOD, AND COMPUTER PROGRAM PRODUCT PROVIDING EDGELESS CARBON NANOTUBE RESONATOR ARRAYS

(75) Inventors: Risto H. S. Kaunisto, Espoo (FI); Jari Kinaret, Mölndal (SE); Eleanor Campbell, Mölndal (SE); Andreas Isacsson, Mölndal (DE); Sang-Wook Lee, DaeGu (KR); Anders Eriksson, Göteborg (SE)

(73) Assignee: Nokia Corporation, Espoo (FI)

( * ) Notice: Subject to any disclaimer, the term of this patent is extended or adjusted under 35 U.S.C. 154(b) by 324 days.

(21) Appl. No.: 12/072,972

(22) Filed: Feb. 29, 2008

(65) Prior Publication Data

US 2009/0219114 A1    Sep. 3, 2009

(51) Int. Cl.
*H03H 9/46* (2006.01)
*H03H 9/52* (2006.01)
*H03H 3/013* (2006.01)

(52) U.S. Cl. ............... 333/186; 977/742; 977/890; 977/932; 977/936

(58) Field of Classification Search ............... 333/186, 333/200; 977/724, 730, 742, 839, 890, 932, 977/936
See application file for complete search history.

(56) References Cited

U.S. PATENT DOCUMENTS

| 6,737,939 | B2  |   | 5/2004  | Hoppe et al. ............ 333/186 |
| 6,995,633 | B2  | * | 2/2006  | Nakamura et al. ........ 333/186 |
| 7,157,990 | B1  |   | 1/2007  | Adam et al. ............ 333/186 |
| 7,301,191 | B1  |   | 11/2007 | Tombler et al. ........... 257/296 |
| 2004/0124951 | A1 | * | 7/2004  | Nakamura et al. ........ 333/186 |
| 2007/0188268 | A1 |   | 8/2007  | Naito et al. ............ 333/186 |
| 2008/0277646 | A1 | * | 11/2008 | Kim et al. .............. 257/14 |

FOREIGN PATENT DOCUMENTS

| WO | WO 02/080360 A1 | 10/2002 |
| WO | WO-03/078305 A1 | 9/2003 |
| WO | WO-2005/112126 A1 | 11/2005 |

OTHER PUBLICATIONS

Jensen K. et al., "Limits of Nanomechanical Resonators", International Conference on Nanoscience and Nanotechnology, Jul. 3-7, 2006, ICONN '06, pp. 68-71, the whole document.

* cited by examiner

*Primary Examiner*—Barbara Summons
(74) *Attorney, Agent, or Firm*—Harrington & Smith

(57) ABSTRACT

A nanotube apparatus is described. The apparatus includes a first electrode having a first edge. An array of nanotubes distributed in a closed path are also included. The closed path surrounds the first electrode and adjacent to the first edge. The closed path is also locally straight. Each of the nanotubes has an end that is free to oscillate. The apparatus also includes a second electrode having a second edge surrounding both the first electrode and the array of nanotubes. Methods are also described.

17 Claims, 5 Drawing Sheets

APPARATUS, METHOD, AND COMPUTER PROGRAM PRODUCT PROVIDING EDGELESS CARBON NANOTUBE RESONATOR ARRAYS

TECHNICAL FIELD

The exemplary embodiments of this invention relate generally carbon nanotube devices and, more specifically, relate to tunable radio frequency filter technologies.

BACKGROUND

Nanoelectromechanical systems (NEMS) are a developing field of nanotechnology. NEMSs include nanotube devices that depend on mechanical movement. Nanotubes may also be referred to as nanorods, nanofibers, and nanowhiskers. A tunable radio frequency (RF) filter is an example of a NEMS.

Some frequency-tunable resonators use a capacitive nature for actuation/transduction. These frequency-tunable resonators typically include massively parallel arrays. The number of tubes or fibers in such arrays is on the order of 10,000-100,000.

The most straightforward geometry for such arrays is shown in FIG. 1. This geometry will work if the tubes are spaced far enough apart that the side electrodes screen the Coulomb interaction between the tubes.

Moving the tubes closer together causes the Coulomb interactions between the tubes to exert more of an effect on the tubes. This interaction is useful in the sense that collective resonances may be used. The drawback to this arrangement, however, is that the charge distribution on the tubes/fibers in the array will not be homogenous. More charge will accumulate on the tubes at the edges of the array than on the ones in the interior of the array.

FIG. 1 illustrates a traditional linear array resonator 100. The incoming RF signal on the gate 110 actuates the CNTs/CNFs (carbon nanotubes/carbon nanofibers) 150 when the source bias voltage VS is such that the system is on resonance with the incoming signal frequency. The bias voltage is the difference between Vg and Vs. The source need not be electrically grounded; it may have a potential Vs and Vg may be offset with the same potential.

Through capacitive transduction, the signal is transferred to the drain electrode 120 when the system is on resonance. Hence the device acts as a tunable filter. Because the tubes are interacting, the charge distribution on the tubes 150 along the array direction (x-direction) is not uniform. The typical distribution is shown as Q in the inset. This distribution may cause the tubes 150 close to the edges to be tuned more and lead to early snap-in.

Due to the disparity of charge, when a sufficient voltage is applied, the tubes 150 at the edges will be more attracted to the electrodes, and may snap into contact as shown in FIG. 2a. Once the two outermost tubes 150 have snapped into contact a DC-path may be available for a current and destruction of the device may result.

While it may be possible to prevent the development of a DC path, for example, by a dielectric layer on the electrode, this presents another problem. As soon as the outermost tubes 150 have snapped to contact, the charge distribution on the remaining tubes 150 in the array is redistributed to once again be focused around the edges. Hence, more tubes 150 may snap into contact (as shown in FIG. 2b). This will lead to a cascade effect where the whole array eventually snaps into contact.

FIG. 2b illustrates the early snap-in cascade phenomena. As shown in FIG. 2 the tubes 150 at the end of the array carry more charge. These tubes 150 are more attracted to the drain electrode 120 than the tubes 150 in the center. Thus they will snap into contact before the inner nanotubes 150. Once the outermost tubes 150 have snapped-in, as shown in FIG. 2a, the charge redistributes such that the two outermost tubes 150 that have not snapped into contact will experience a larger force. These will then snap into contact as well, as shown in FIG. 2b. This creates a cascade effect which may result in all of the tubes 150 snapping into contact.

Because the main transduction comes from the members in the interior of the array the snap-in cascade effect results in the full frequency tuning range of the device being unavailable.

Reference may be made to PCT/SE02/00853 for a description of a nanotube relay device where a nanotube flexes to close an electrical circuit.

PCT/SE05/00691 describes an arranging of several nanorelays that exploit the electromechanical resonance of the system to function as a filter. See U.S. Pat. No. 6,737,939 and U.S. Pat. No. 7,301,191 for further examples.

Some prior solutions to the snap-in problem have been presented, for instance, having a non-uniform spacing between the tubes, the inter-tube distance increasing near the edges, or using electrodes that curve away close to the edges. The drawback of the first solution is that interactions between members in the array become non-uniform and collective resonant modes are less likely to prevent disorder induced broadening of the resonance. Both alternative solutions also suffer from fabrication caveats because they require either patterning of tubes or the electrode geometry to be precisely controlled.

What is needed is a more practical solution that enhances the tuning range of resonators by solving the problem of charge accumulation at the nanotube array edges.

SUMMARY

An exemplary embodiment in accordance with this invention is a nanotube apparatus. The apparatus includes a first electrode having a first edge. An array of nanotubes distributed in a closed path are also included. The closed path surrounds the first electrode and adjacent to the first edge. The closed path is also locally straight. Each of the nanotubes has an end that is free to oscillate. The apparatus also includes a second electrode having a second edge surrounding both the first electrode and the array of nanotubes.

A further exemplary embodiment in accordance with this invention is a method for making a nanotube resonator. The method includes providing a substrate. A first electrode having a first edge is formed on the substrate. An array of nanotubes is disposed on the substrate in a closed path. The closed path is adjacent to the first edge and surrounds the first electrode. An end of each of the nanotubes is free to move (e.g., oscillate).

Another exemplary embodiment in accordance with this invention is a method for using a nanotube resonator. The method includes providing a resonator structure. The resonator structure includes a first electrode, an array of nanotubes, and a second electrode. The array of nanotubes is arranged in a closed path. The closed path is adjacent to a first edge of the first electrode and surrounding the first electrode. The second electrode is adjacent to the array of nanotubes and surrounding both the first electrode and the array of nanotubes. Each of the nanotubes has an end that is free to oscillate at a resonant frequency. The method also includes applying a bias current to the array of nanotubes to establish a resonant frequency of the array of nanotubes. A signal is applied to one of the first electrode and the second electrode. A current is received from the array of nanotubes at the second electrode based on the signal applied to the first electrode.

Another exemplary embodiment in accordance with this invention is a nanotube apparatus. The apparatus includes a resonator means. The resonator means includes a first electrode, an array of nanotubes, and a second electrode. The array of nanotubes is arranged in a closed path. The closed path is adjacent to a first edge of the first electrode and surrounding the first electrode. The second electrode is adjacent to the array of nanotubes and surrounding both the first electrode and the array of nanotubes. Each of the nanotubes has an end that is free to oscillate at a resonant frequency. The apparatus also includes a means for applying a bias current to the array of nanotubes to establish a resonant frequency of the array of nanotubes. A means for applying a signal to one of the first electrode and the second electrode is also included. The apparatus also includes a means for receiving a current between the array of nanotubes and the second electrode based on the signal applied to the first electrode.

BRIEF DESCRIPTION OF THE DRAWINGS

The foregoing and other aspects of embodiments of this invention are made more evident in the following Detailed Description, when read in conjunction with the attached Drawing FIGs., wherein.

DETAILED DESCRIPTION

An exemplary embodiment in accordance with this invention provides an alternative geometry for nanotube arrays that prevents the early snap effect and allows the full tuning range of the system to be utilized.

Exemplary embodiments in accordance with this invention relate to RF front end design and more specifically to tunable RF filter technologies. NEMS structures in accordance with an exemplary embodiment of this invention enable miniaturized high-Q resonators with low-voltage tuning capabilities. These components may be used in a wide variety of devices, for example, software-defined and cognitive radio hardware.

Exemplary embodiments in accordance with this invention enhance the tuning range of nanotube resonators by introducing a better geometrical shape that removes the issue of charge accumulation at the nanotube array edges. By removing the charge accumulation the early snap-in effect is prevented and thus allows the full tuning range of the system to be utilized.

Figure 4:
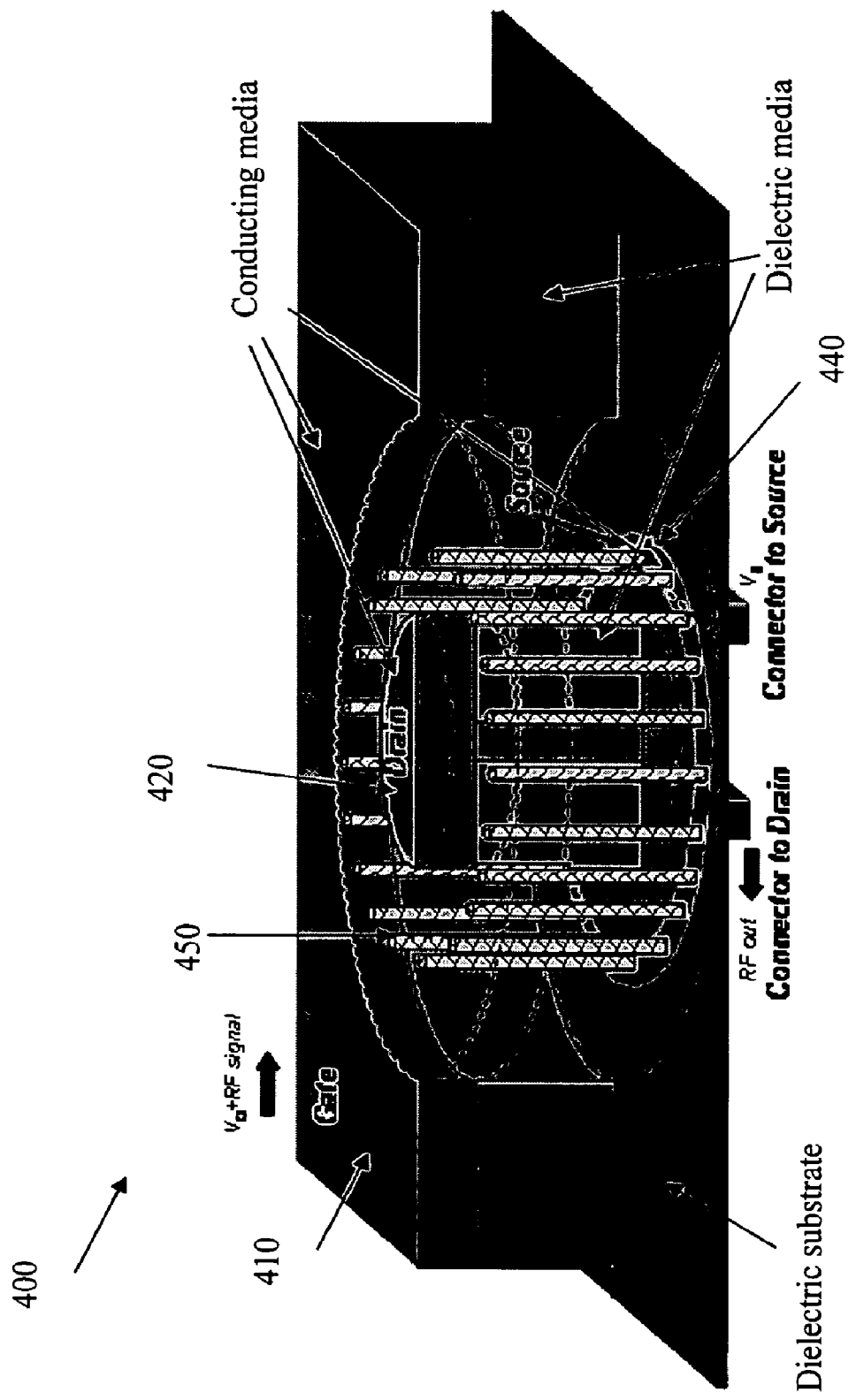
FIG. 4 shows an exemplary block diagram illustrating an exemplary embodiment in accordance with this invention.

FIG. 4 shows an illustration of an exemplary embodiment of a device in accordance with this invention. The electrodes each have a circular edge. Either the gate or the drain may be in the center. As shown in FIG. 4, the drain electrode 420 is in the center as a non-limiting example.

The source electrode 440, on top of which the tubes 450 are placed, lies in between the gate electrode 410 and drain electrode 420. Because there are no edges on the array, the problem of charge accumulation at the edges of the array is absent, and hence the problem of early snap-in is solved.

While the nanotube array 450 in FIG. 4 is shown as circular, this is only a non-limiting example. As shown, the curvature of the array is large enough for the array to be locally straight. It should be appreciated that other geometries are within the scope of this invention. As used, locally straight describes a geometry where there are no edges along the continuous line. An array of nanotubes may be locally straight if there exists an unambiguous tangent line which is substantially parallel to that of the neighboring tubes. When examined under sufficient magnification the array appears to be straight.

Alternate geometrical configurations that prevent early snap-in effects and allow the full tuning range of the system may be utilized. These geometries may be chosen so that the charge distribution on the system remains homogenous throughout the whole tuning range regardless of bias voltage.

Figure 1:
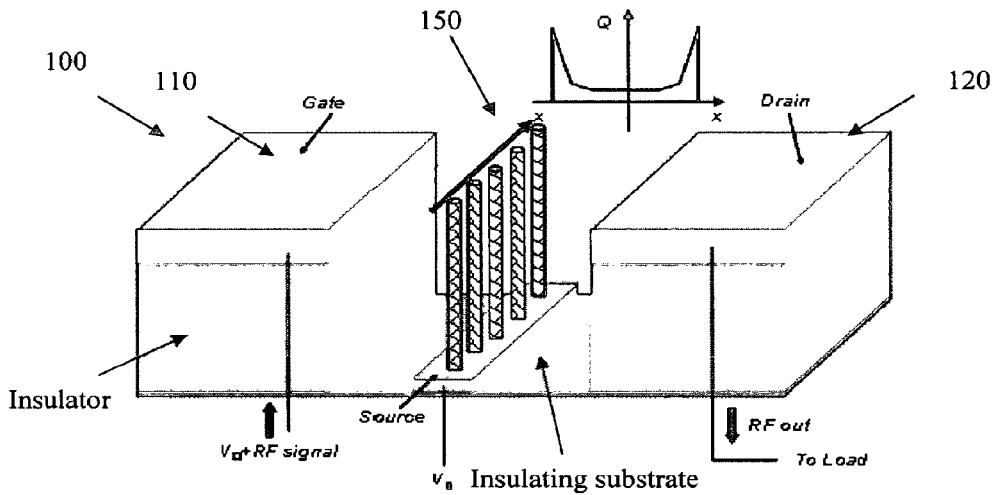
FIG. 1 shows an exemplary block diagram illustrating a traditional linear nanotube array NEMS.
Figure 2A:
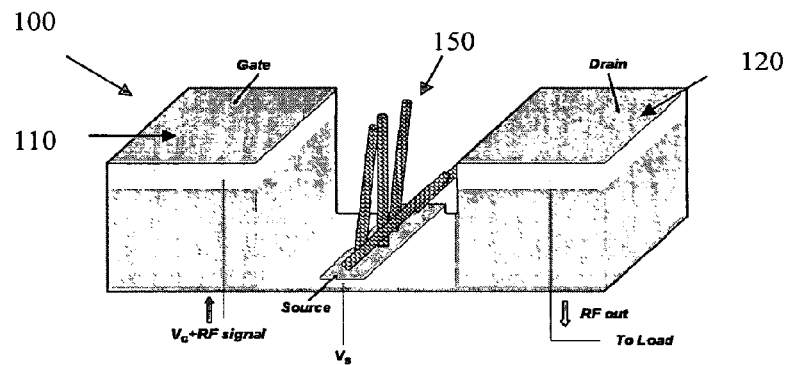
FIGS. 2a and 2b show exemplary block diagrams illustrating a traditional linear nanotube array NEMS during a snap-in cascade.
Figure 2B:
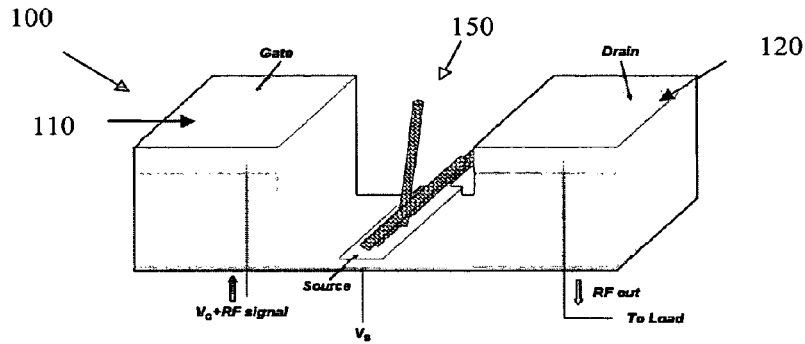

For typical array sizes the local geometry may be equivalent to the traditional geometry as shown in FIG. 1; therefore the effect of the curvature on the functionality is negligible. As described, there are no edges on the array. Thus, the problem of having charge accumulation at the edges of the system is also absent, and hence early snap-in is prevented.

Figure 3A:
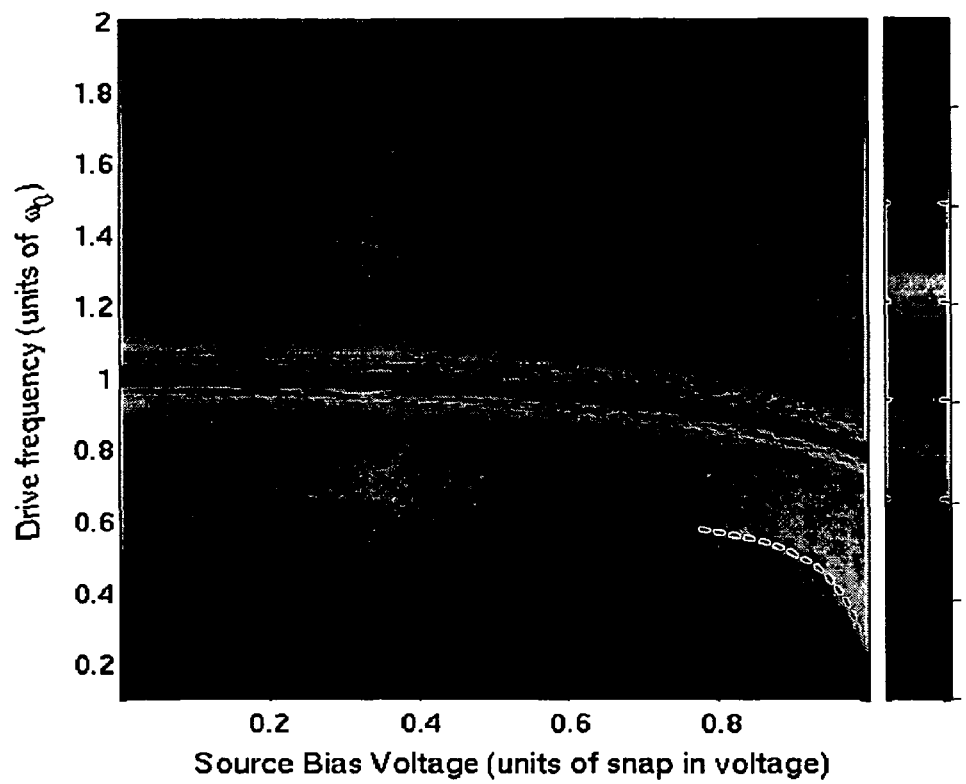
FIG. 3a depicts a response function for a traditional NEMS system.
Figure 3B:
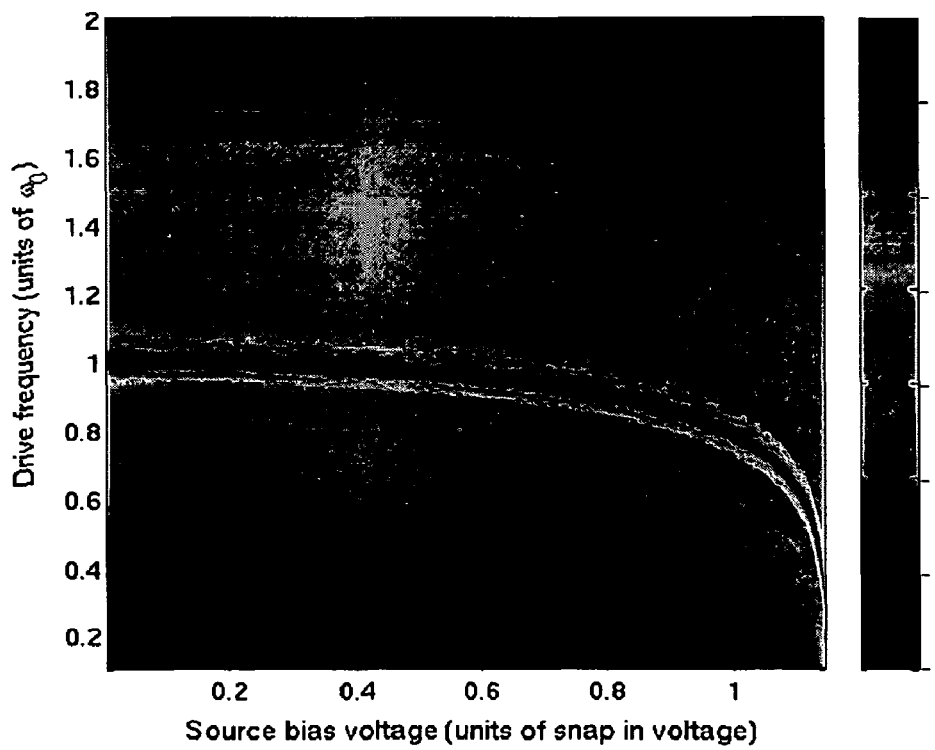
FIG. 3b depicts a response function for a NEMS system in accordance with this invention.

FIGS. 3a and 3b provide a comparison of the response function of the traditional system and an exemplary embodiment of this invention. In FIG. 3a the response function for a traditional system is shown.

In FIG. 3b the response function for a system in accordance with this invention is shown. The tuning range is considerably larger than for a linear array. It should be appreciated, that a purely circular geometry is by no means necessary. Other geometries where the array members lie on a closed path, i.e. edgeless, may also be used. A closed path is edgeless in that there is no starting edge or ending edge.

In addition to a three terminal geometry, a two terminal geometry may also be utilized in some resonator applications. For a two terminal case either the outer or the inner electrode will be absent, e.g., only the outer electrode (shown as a gate electrode 410 in FIG. 4) or the inner electrode (shown as a drain electrode 440 in FIG. 4). All arguments relating to larger tuning range and prevented early snap-in apply as for the two terminal case.

Figure 5:
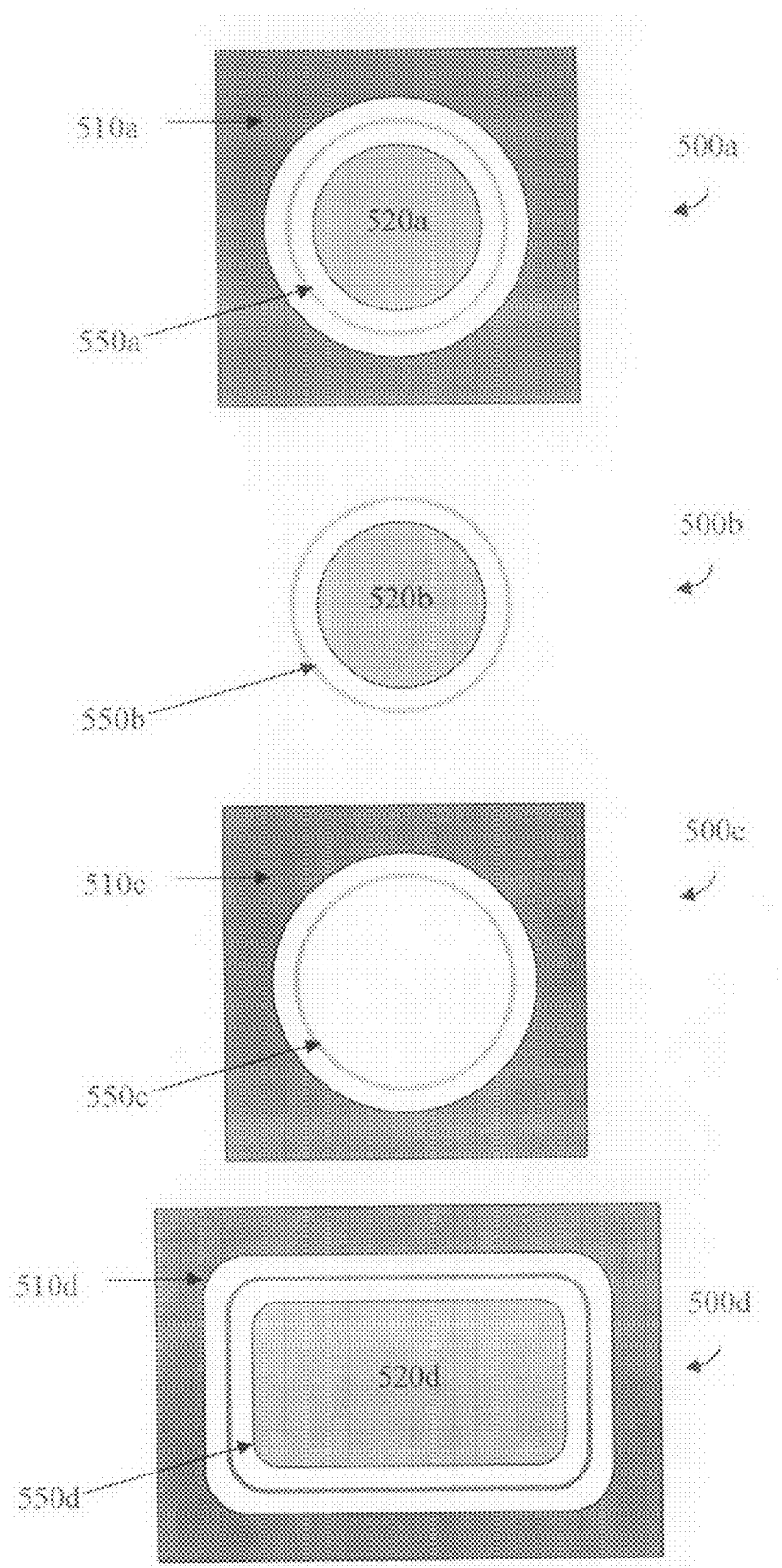
FIG. 5 shows additional exemplary block diagrams illustrating exemplary embodiments in accordance with this invention.

FIG. 5 shows additional block diagrams illustrating exemplary embodiments in accordance with this invention. As shown, NEMS 500a has electrodes 510a and 520a. Between electrodes 510a and 520a is the nanotube array 550a. In NEMS 500a, the nanotube array 550a has a circular geometry.

NEMS 500b shows a block diagram where only the inner electrode 520b is present and the nanotube array 550b is adjacent to the edge of the inner electrode 520b. In NEMS 500c only the outer electrode 510c is present with the nanotube array 550c adjacent to an inner edge of the electrode 510c.

As shown, the nanotube array 550b and the edge of the inner electrode 520b do not abut each other. It should be appreciated that to be adjacent the nanotube array 550*b* and the edge of the inner electrode 520*b* need only be near each other.

NEMS 500*d* shows a block diagram where the electrodes 510*d*, 520*d* and the nanotube array 550*d* use a non-circular geometry, here a rounded rectangle. The curvature of the rounded edges is such that the array is locally straight.

An advantage of the exemplary embodiments of this invention is that it solves the problem of limited tuning range occurring due to effects of having edges in the system.

FIGS. 3*a* and 3*b* show numerical simulations of the dynamical response function for two arrays with 128 tubes as a function of applied source voltage $V_s$ and drive frequency.

The reduction in range of a linear array is illustrated in FIGS. 3*a* and 3*b* where the frequency response of a small array is shown as a plot as a function of applied bias voltage (x-axis). The y-axis displays frequency tuning in units of natural vibration frequency.

The central dark 'strip' represents large response (resonant behavior) while the dark areas near the top and bottom borders represent off resonant behavior. For clarity the logarithm of the response function is shown on FIG. 3*a*.

In FIG. 3*a* a linear array has been simulated. In this graph, the low frequency response of the tubes at the edges that lead to early snap to contact can also be seen. While a clear tuning of the main resonance can be seen, the system experiences a snap-in already after 20% of tuning of the main peak. This is a result of the edge tuning faster to zero frequency. It can be seen from the edge of the distribution (dashed line drawn for clarity).

In FIG. 3*b* the corresponding graph for a system where the tubes are placed in a closed path geometry in accordance with this invention. As can be seen the full tuning range can now be utilized.

Figure 6:
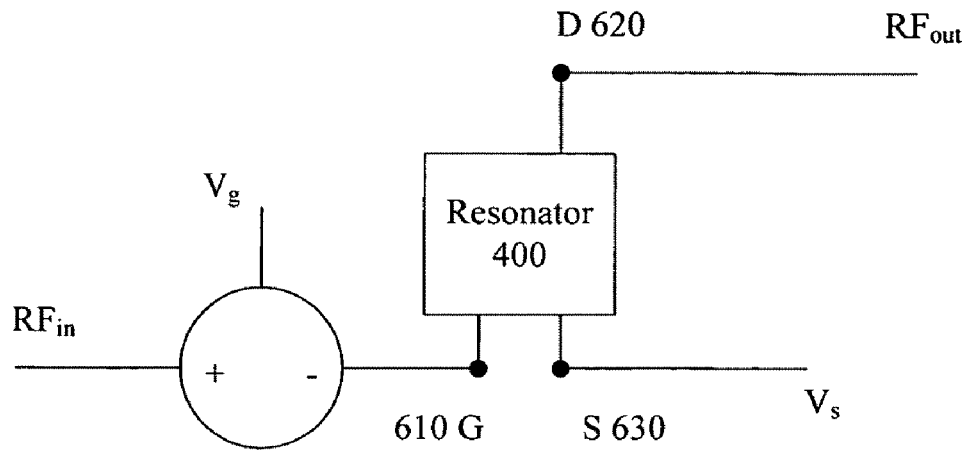
FIG. 6 is a simplified diagram of a nanotube transistor.

FIG. 6 is a simplified block diagram of a circuit using a resonator 400 in accordance with this invention. The circuit has a gate 610, a source 630, a drain 620 and a resonator 400. A supply voltage $V_s$ may be provided to the source 630. The gate 610 controls the mechanical resonance of the resonator 400. The resonator is capacitancely connected to the drain 620. When the resonators resonate there is a time-varying capacitance between the resonator 400 (and thus the source 630) and the drain 620.

The radio frequency signal (RF) is added with the gate bias voltage $V_g$ and supplied to the gate 610. A filtered RF signal is output to the drain 620 when the input signal has a frequency that is compatible to the resonant frequency of the array. Since the resonator 400 uses a closed path geometry, the resonator avoids the snap-in effect and maintains a full tuning range.

Typically a filter consists of one or more resonators coupled to each other either capacitively or inductively. In a two-terminal resonator, where either the inner or outer electrode is absent, the remaining electrode may receive a combined RF signal and tuning voltage.

Figure 7:
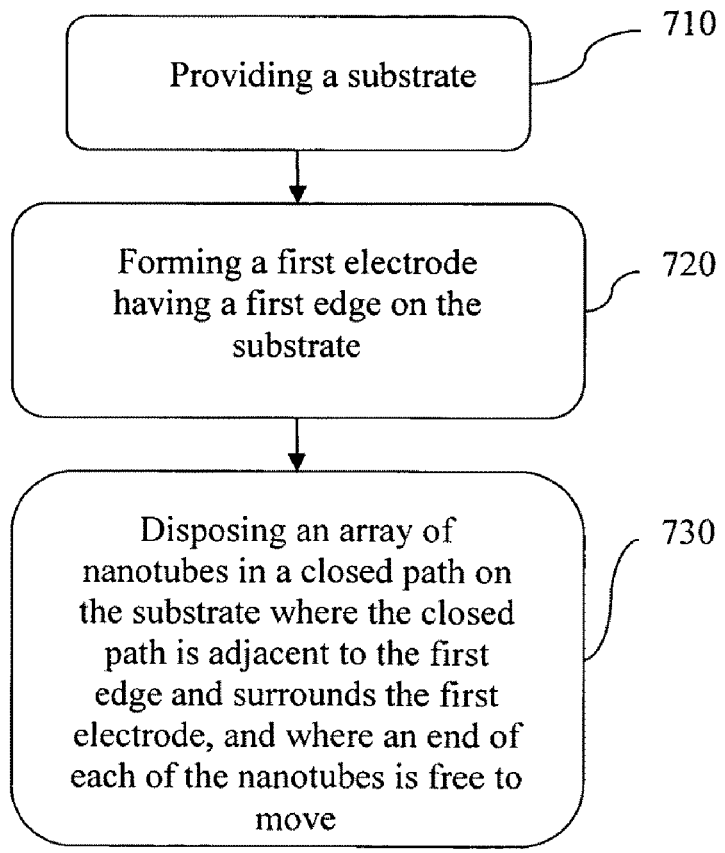
FIG. 7 illustrates a method in accordance with this invention.

FIG. 7 illustrates a method in accordance with this invention. In step 710, a substrate is provided. A first electrode having a first edge is formed on the substrate, in step 720. In step 730, an array of nanotubes is disposed in a closed path on the substrate where the array of nanotubes is adjacent to the first edge and surrounds the first electrode, and where an end of each of the nanotubes is free to move. As described in this non-limiting example, the nanotube array is in a vertical arrangement in relation to the substrate.

In a further exemplary embodiment of the method above, disposing the array of nanotubes comprises growing the nanotubes on the substrate using chemical vapor deposition.

The exemplary embodiments of the invention, as discussed above and as particularly described with respect to exemplary methods, may be implemented as a computer program product comprising program instructions embodied on a tangible computer-readable medium. Execution of the program instructions results in operations comprising steps of utilizing the exemplary embodiments or steps of the method.

In general, the various embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention.

In addition, while mention is made to CNTs/CNFs (carbon nanotubes/carbon nanofibers) as the main material for the resonator cantilevers, the invention applies to other cantilever materials as well, for instance Si.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. An apparatus comprising:
   a first electrode having a first edge;
   an array of nanotubes distributed in a closed path, where the closed path surrounds the first electrode and adjacent to the first edge, the closed path is locally straight, and where each of the nanotubes comprises an end that is free to oscillate; and
   a second electrode having a second edge surrounding both the first electrode and the array of nanotubes.

2. The apparatus of claim 1, wherein the first electrode is a gate and the second electrode is a drain.

3. The apparatus of claim 1, wherein the first electrode is a drain and the second electrode is a gate.

4. The apparatus of claim 1, wherein the closed path is circular, the first edge is circular and the second edge is circular.

5. The apparatus of claim 1, wherein the apparatus is a tunable radio frequency filter.

6. The apparatus of claim 1, further comprising a source electrode, wherein the array of nanotubes is electrically connected to the source electrode.

7. The apparatus of claim 1, where a bias current applied to the nanotubes alters a resonant frequency of the nanotubes.

8. A method comprising:
   providing a substrate;
   forming a first electrode having a first edge on the substrate;
   disposing an array of nanotubes in a closed path on the substrate where the closed path is adjacent to the first edge and surrounds the first electrode, and where an end of each of the nanotubes is free to move.

9. The method of claim 8, further comprising disposing a second electrode having a second edge on the substrate, wherein the second edge is adjacent to the array of nanotubes.

10. The method of claim 8, wherein the closed path is circular.

11. The method of claim 8, wherein disposing the array of nanotubes comprises growing the nanotubes on the substrate using chemical vapor deposition.

12. The method of claim 8, controlled at least in part as a result of execution of computer program instructions stored in a computer readable memory medium.

13. A method comprising:
   providing a resonator structure comprising:
   a first electrode,
   an array of nanotubes arranged in a closed path, where the closed path is adjacent to a first edge of the first electrode and surrounding the first electrode, and
   a second electrode adjacent to the array of nanotubes and surrounding both the first electrode and the array of nanotubes;
   where each of the nanotubes comprises an end that is free to oscillate at a resonant frequency;
   applying a bias current to the array of nanotubes to establish a resonant frequency of the array of nanotubes;
   applying a signal to one of the first electrode and the second electrode; and
   receiving a current between the array of nanotubes and the second electrode based on the signal applied to the first electrode.

14. The method of claim 13, further comprising adjusting the bias current to the array of nanotubes.

15. The method of claim 13, controlled at least in part as a result of execution of computer program instructions stored in a computer readable memory medium.

16. An apparatus comprising:
   resonator means for providing:
   a first electrode,
   an array of nanotubes arranged in a closed path, where the closed path is adjacent to a first edge of the first electrode and surrounding the first electrode, and
   a second electrode adjacent to the array of nanotubes and surrounding both the first electrode and the array of nanotubes;
   where each of the nanotubes comprises an end that is free to oscillate at a resonant frequency;
   means for applying a bias current to the array of nanotubes to establish a resonant frequency of the array of nanotubes;
   means for applying a signal to one of the first electrode and the second electrode; and
   means for receiving a current that is conducted between the array of nanotubes and the second electrode based on the signal applied to the first electrode.

17. The apparatus of claim 16, where the resonator means is a radio frequency filter.

* * * * *